Jan. 29, 1963 V. L. NEWHOUSE ETAL 3,076,102

CRYOGENIC ELECTRONIC GATING CIRCUIT

Filed Sept. 2, 1958 2 Sheets-Sheet 1

Inventors:
Vernon L. Newhouse;
John W. Bremer,
by John R. O'Malley
Their Attorney.

Inventors:
Vernon L. Newhouse;
John W. Bremer,
by John R. O'Malley
Their Attorney.

United States Patent Office 3,076,102

Patented Jan. 29, 1963

3,076,102
CRYOGENIC ELECTRONIC GATING CIRCUIT

Vernon L. Newhouse, Scotia, and John W. Bremer, Schenectady, N.Y., assignors to General Electric Company, a corporation of New York Filed Sept. 2, 1958, Ser. No. 758,474
14 Claims. (Cl. 307—88.5)

Figure 1:
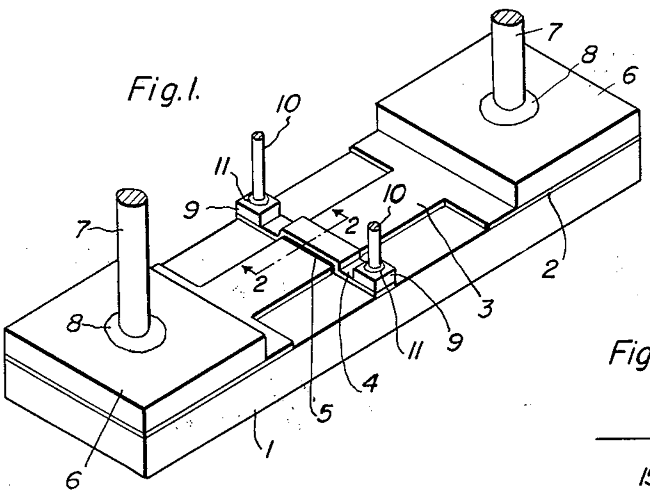

The present invention relates to an improved cryogenic electronic device and a preferred method of operating this device.

When some elements and some metallic alloys are cooled to temperatures close to absolute zero their resistances drop suddenly to zero. This phenomenon is known as superconductivity; that is, when these materials have zero resistance, they are said to be superconductive. 22 elements are superconductive as well as many metallic alloys, some of which are not formed from these 22 elements. All of the 22 elements become superconductive at temperatures below 11.2° K., the particular critical temperature depending upon the particular element. The highest critical temperature for a known superconductive alloy is 20° K.

These superconductive materials possess other interesting characteristics when in the superconductive state besides absolutely zero resistance. They exclude magnetic fields of magnitudes below a value called the critical field. The critical field depends upon the particular superconductive material as well as its temperature. When a field of magnitude greater than the critical field is applied to a superconductive material the material reverts to its normal resistance even though it is maintained below the critical temperature. Superconductivity can also be destroyed by a current through the superconductive material greater in magnitude than the critical current, which is the value of the current at which the material reverts to its normal resistance. This phenomenon can be partially explained by a consideration of the magnetic field produced by this current which, of course, when it reaches the magnitude of the critical field, causes the superconductive material to revert to its normal state.

In recent years, cryogenic electronic devices have been developed in which the above-mentioned phenomena are utilized to produce useful results in electronic circuits. A cryogenic electronic device is an electronic element in which the state of a superconductive member, called a gate circuit, is controlled by current flow through a control circuit that is adjacent the superconductive member. In prior cryogenic electronic devices, this control has been obtained from the magnetic field produced by the current through the control circuit. But the present definition is broad enough to include other types of control.

One obvious use for these cryogenic electronic devices is the control of current through a load placed in parallel with the gate circuit and a current source. When the gate circuit is superconductive the load is shunted by a zero resistance element and thus all of the current from the current source flows through the gate circuit. However, when the gate circuit is made resistive, by current flow through the control circuit, the current from the current source divides between the load and the gate circuit according to their resistances or inductances.

It can be shown that the upper limit of frequency operation of cryogenic electronic devices is dependent upon $R/L$ wherein R is the resistance of the gate circuit and L is the inductance of the control circuit. In many applications, for example in computers, an electronic device with a very high maximum frequency of operation is desired.

Accordingly, an object of the present invention is to provide a cryogenic electronic device having a high maximum frequency of operation.

Another object is to provide a cryogenic electronic device having a low inductance control circuit and a high resistance gate circuit.

In some applications, particularly computers, the size of the cryogenic electronic device and the cost per device are extremely important due to the large number of these devices used.

Hence, another object is to produce a small cryogenic electronic device.

A further object is to produce an inexpensive cryogenic electronic device.

Still another object is to provide a cryogenic electronic device that can be produced by printed circuit techniques.

A still further object is to provide a method of operation of a cryogenic electronic device.

These and other objects are obtained by one cryogenic electronic device embodiment of our invention comprising an elongated thin film of superconductive material deposited on a substrate to form the gate circuit. This gate circuit is controlled by another thin film of superconductive material, having a higher critical field, which is deposited transversely of the gate circuit thin film. This second thin film forms the control circuit. When a current is passed through the control circuit a narrow area of the thin film of the gate circuit beneath the control circuit reverts to normal resistance. Then current of sufficient magnitude through the gate circuit causes this area of normal material to propagate in a short time over the complete volume of the gate circuit thereby causing the gate circuit to revert entirely to the normal state.

Figures 2, 3:
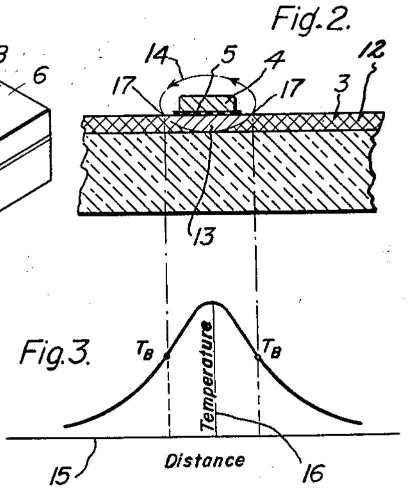
Figure 4:
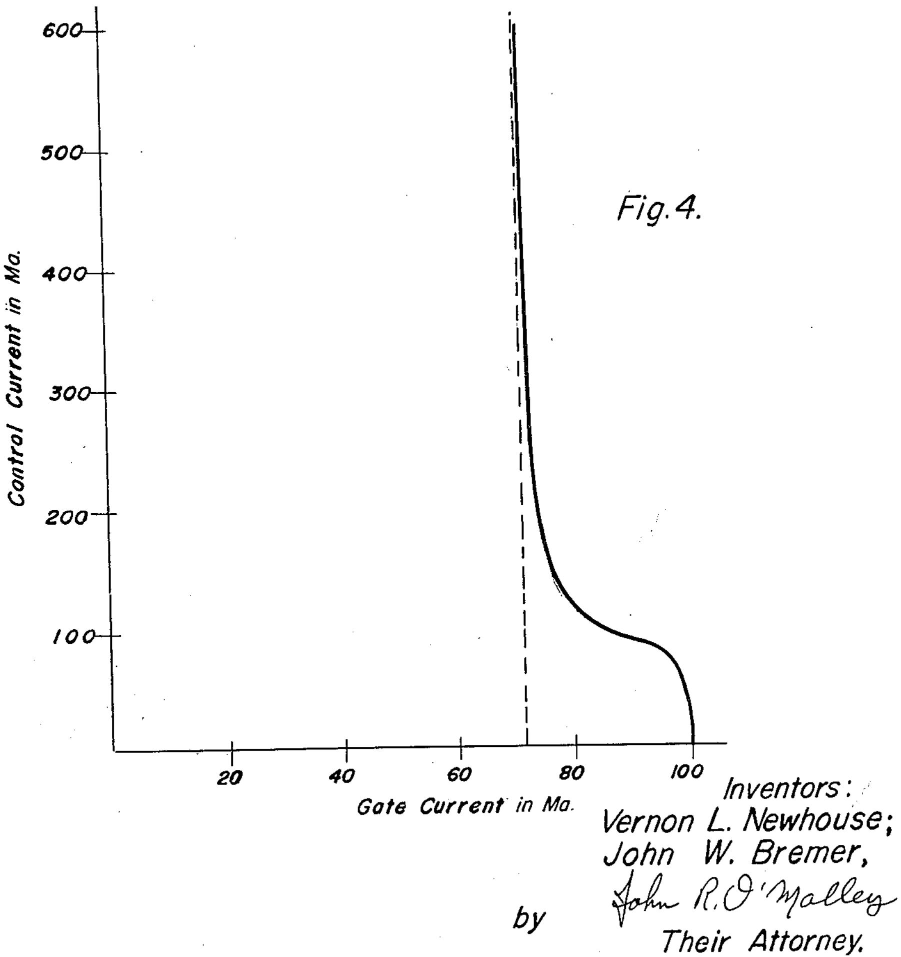
Figure 5:
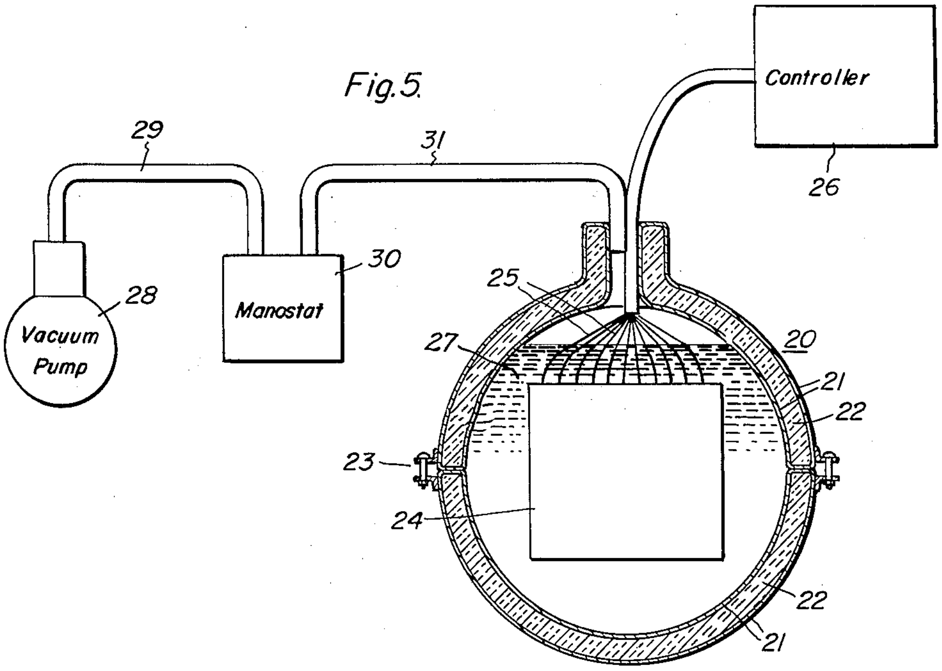
Figure 6:
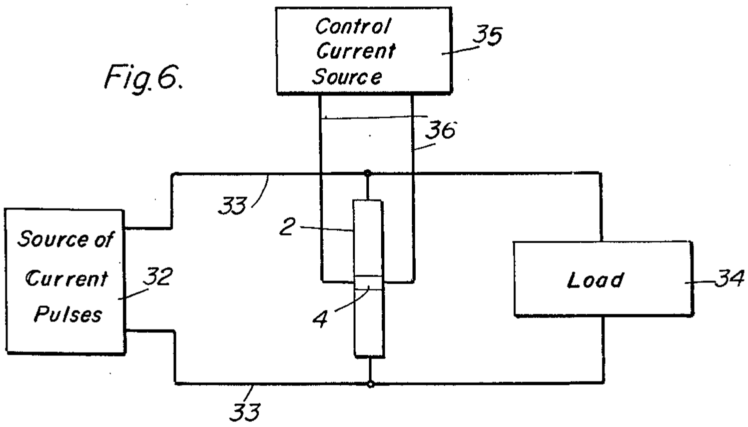

The novel features believed characteristic of the invention are set forth in the appendent claims. The invention itself, together with further objects and advantages thereof may best be understood by reference to the following description, taken in connection with the accompanying drawings, in which;

FIG. 1 is a perspective view of a preferred embodiment of the cryogenic electronic device of our invention, FIG. 2 is a partial cross-sectional view of FIG. 1 taken along the line 2—2, FIG. 3 is a graph of the temperature distribution in the cross-section of FIG. 2, FIG. 4 is a graph of typical operating currents for the device of FIG. 1, FIG. 5 is a schematic illustration of components that provides a suitable environment for the cryogenic electronic device of FIG. 1, and FIG. 6 is a block diagram illustrating the preferred mode of operation of the cryogenic electronic device of FIG. 1.

The cryogenic electronic device of FIG. 1 comprises a substrate 1 on which a superconductive film 2 is deposited in a pattern having a narrow portion 3. This narrow portion 3 is the gate circuit for this cryogenic electronic device. Across narrow portion 3 a superconductive film 4 is deposited, which forms the control circuit for this cryogenic electronic device. It is insulated from film 3 by an insulator 5. The two ends of film 2 are covered by two terminals 6 that are made much thicker than film 2 so that two terminal posts 7 can be soldered thereto at solder points 8. Film 4 is also provided with two terminals 9 to which two terminal posts 10 are connected at solder points 11.

Before a more detailed explanation of the components of the cryogenic electronic device of FIG. 1 a brief discussion of the operation of this device will be presented so that the details of these components can be more fully appreciated. In the operation of the cryogenic electronic device of FIG. 1, a current source applied across terminal posts 10 causes current flow through film 4. This current flow, which produces a magnetic field greater than the critical field of film 2, reverts the material of film 2 beneath film 4 to the normal state, thereby producing a small narrow area of normal material extending across the width of the narrow portion 3 of film 2. If during the formation of this normal area a current source is applied to terminal posts 7 to cause current flow through the narrow portion 3 of sufficient magnitude, the normal material in narrow portion 3 rapidly increases and propagates over the whole volume of narrow portion 3, causing the entire superconductive film 2 to revert to the normal resistance. This propagation of the normal material is caused by the spread of Joule heat which raises the temperature of the narrow portion 3 above the critical temperature.

From this brief explanation, it should be appreciated that substrate 1 should have high thermal diffusivity so that it inhibits as littls as possible the speed of the heat propagation through the narrow portion 3 of film 2. On the other hand, substrate 1 should have a high thermal conductivity so that when current in the gate circuit is terminated, film 2 cools as fast as possible by the condition of heat to substrate 1 to thereby revert quickly to the superconductive state. Unfortunately, since the materials having the highest thermal diffusivity do not necessarily have the highest thermal conductivity, a compromise must be made. Some of the suitable materials for substrate 1 are; sapphire, quartz, glass, and aluminum with a thin insulating layer of $Al_2O_3$. Substrate 1 should not only be thick enough to conduct heat from film 2 in sufficient quantity, but also be thick enough to provide physical support form film 2. In many applications substrate 1 is at least 100 times the thickness of film 2.

Film 2 should be formed from a superconductive material that readily deposits in a film, is easy to handle, and that has a critical temperature close to the temperature of liquid helium at atmospheric pressure. Tin is one of the superconductive materials meeting these requirements.

This critical temperature requirement relates to the use of liquid helium for the refrigerant for cryogenic electronic devices, and to the operation of cryogenic electronic devices at a temperature only slightly less than the critical temperature of the gate circuit. By selecting the critical temperature of film 2 close to that of the temperature of liquid helium at atmospheric pressure, very simple vacuum seals and pressure or vacuum pump arrangements can be used to produce a pressure on the liquid helium such that the temperature of the liquid helium is at the desired operating temperature for the cryogenic electronic device.

If the length of the narrow portion 3 of film 2 is short, the time for propagation of the normal material is short. But on the other hand, this length should not be so short that the normal resistance of the narrow portion 3 is too small. If film 2 is formed from tin, typical lengths of the narrow portion 3 are within the range of 1–10 millimeters.

The narrow portion 3 of film 2 should be narrow so that the resistance of portion 3 is high. But there is a practical limit to the decrease in width of portion 3 since the critical current decreases with decreases in this width.

Since in many applications film 2, when in a superconductive state, must pass a significant current, the critical current should not be too low. For many applications in which film 2 is formed from tin, the width of narrow portion 3 is within the range of 1–4 millimeters.

Film 2 should be made as thin as is compatible with the desired critical current amplitude since the resistance increases with decrease in thickness. For a tin film 2 the range of thickness may be, for example, of the order of 1/10 micron to 1 micron.

The material from which film 4 is formed should have a higher critical temperature than film 2 so that at the temperature of operation, film 4 is superconductive. Then there is no resistance in the control circuit and thus no power loss. Film 4 should also have a higher critical field than film 2 so that a current passed by film 4 that produces a critical field in a portion of narrow portion 3, does not revert film 4 to the normal resistance. If film 2 is formed from tin, film 4 may be formed from lead.

If film 4 is narrow and thin, the current through film 4 produces a field of maximum intensity at the surface of film 2. The thickness of film 4 may be of the order of thickness of film 2 and the width 1/10–1/1000 of the length of the narrow portion 3 of film 2.

Almost any insulating material that can be deposited on film 2 can be used for insulator 5. Silicon monoxide is one suitable material.

In some applications film 4 may not be insulated from film 2 and in fact may be merely a continuation of film 2. But in most applications the gate circuit will have to be insulated from the control circuit and thus an insulator 5 employed.

The axis of film 4 does not necessarily have to be at a right angle with the axis of the narrow portion 3 of film 2, such as is illustrated. But for the least inductance coupling between film 4 and film 2, these axes are at right angles and film 4 extends over the center portion of narrow portion 3.

Due to the thinness of films 2 and 4, terminal posts 7 and 10, respectively, cannot be connected directly to these films. Thus, terminals 6 and 9 are provided at the ends of films 2 and 4, respectively, for the connection of terminal posts 7 and 10, respectively, thereto. Terminals 6 and 9 and terminal posts 7 and 10 should always remain superconductive and thus may be formed of the same material from which film 4 is formed.

The operating temperature, that is the ambient temperature, for the cryogenic electronic device depends upon the magnitude of current conducted by film 2 since, as will be shown, the current passing through film 2 should be slightly less than the critical current. Of course the critical current is a function of an operating temperature. If film is formed from tin, the operating temperatures for many applications will be within the range of 3.5 to 3.8° K. For lower temperatures the critical current is too large and for higher temperatures is too small.

The operation of the cryogenic electronic device of FIG. 1 can be better understood by reference to FIGS. 2 and 3. In FIG. 2 we have illustrated film 2 as having a superconductive portion 12 and also a portion 13 of normal material produced by flux lines 14 from current passing through film 4.

In FIG. 3 we have illustrated a graph of the temperature distribution produced by the current in film 2 passing through the portion 13 of normal material. The units along the abscissa 15 correspond to distance along the length of the narrow portion 3 of film 2 and the units along the ordinate 16 correspond to the temperature of film 2. The temperature is at a maximum at the center of portion 13, since the heat loss there is a minimum, and decreases to a value $T_b$ at the border points 17 of the portion 13. When this temperature $T_b$ is greater than the critical temperature of the material of film 2, the normal material 13 spreads towards both ends of narrow portion 3 at a rate determined by the diffusivity of the film 2 and of the substrate 1. If the temperature $T_b$ is less than the critical temperature, the portion 13 of normal material does not propagate and the resistance of film 2 although not at zero is only that resistance of the portion 13 of normal material, which may be the order of 1/1000 of the resistance obtained when the whole volume of narrow portion 3 is of normal material. Another way of stating the conditions for propagations is that propagation is obtained when for an increase in volume of the portion 13 of normal material, the increase in Joule heat produced thereby is greater than the increase in heat loss.

When the current through the control circuit either alone or in combination with the current through the gate circuit produces a small, narrow, area of normal material across the entire width of the portion 3, the current through this narrow portion 3 must pass through the normal material. Current passing through the normal material 13 produces heat and, if it is of a sufficient magnitude, causes a rapid propagation of the normal material over the complete volume of narrow portion 3 thereby reverting the narrow portion 3 to the resistive state. When the current through film 2 is terminated the narrow portion 3 cools through heat loss to substrate 1, and after a short time has a temperature less than the critical temperature and thus reverts to the superconductive state.

In FIG. 4 we have shown a typical relation between the control current and the gate current for creation and propagation of the normal material 13 when film 2 is formed from tin and film 4 is formed from lead. The units along the abscissa correspond to the gate current in milliamps and the units along the ordinate correspond to the control current in milliamps. The dotted line at the gate current of approximately 70 milliamps indicates that for this particular cryogenic electronic device, there is no progagation of the normal material 13 when the gate current is less than 70 milliamps regardless of the control current magnitude. From the curve it is seen that for current gain, that is, for operation in which the gate current controlled is more than the controlling current, the gate current must be very close to the critical current of 100 milliamperes. Since in most applications, current gain is desirable, the cryogenic electronic device is thus operated at very close to the critical current for the gate circuit.

The curve of FIG. 4 is for only one specific cryogenic electronic device. The shape of this curve depends upon many factors including the materials used for film 2 and 4, the purity of these materials, the regularity of these films 2 and 4, and other factors. At present, curves such as FIG. 4 cannot be calculated mathematically but can only be obtained empirically.

Although, as previously stated, in most applications film 4 will be superconductive at all times so there is no energy lost in the control circuit, the cryogenic electronic device of FIG. 1 will operate even though film 4 is an ordinary conductor or even if it is a high resistance. In the latter cases the heat loss in the film 4 lowers the critical field for the portion of film 2 immediately beneath film 4. Then a smaller current is required in film 4 to produce the portion 13 of normal material. In an application in which a high resistance is used for film 4, the reversion to the normal material 13 may be due to heat alone.

In FIG. 5 we have illustrated equipment that may be used to produce a suitable environment for the operation of the cryogenic electronic device of FIG. 1. In FIG. 5 an insulating container 20 is provided comprising two metallic spheres 21 between which there is some suitable insulation 22. These spheres 21 can be opened along flanges 23 enabling the placement in container 20 of printed circuit boards 24 occupying a volume perhaps of a cubic foot. On circuit boards 24 a large number, e.g. a quarter of a million, of the cryogenic electronic devices may be printed. These cryogenic electronic devices are connected by wires 25 to controller 26 for a computer, the principal portion of which is comprised by boards 24. Controller 26 includes the energizing sources for the computer. Liquid helium 27 surrounds the circuit boards 24 for maintaining the cryogenic electronic devices at the desired operating temperature.

The temperature of the liquid helium is, of course, a function of the pressure on the helium. For operating temperatures of 3.5 to 3.8° K. this pressure is slightly less then atmospheric pressure. Thus, a vacuum arrangement is required.

The illustrated vacuum arrangement comprises a vacuum pump 28 that causes air to flow through a conduit 29 from a manostat 30 which is connected by another conduit 31 to the neck of the insulating container 20. The manostat 30 regulates the pressure on the liquid helium 27.

Before referring to the preferred method of operation as embodied in the illustration of FIG. 6, some general characteristics of operation should be considered. In accordance with a feature of the present invention the control current in our device never reverts the whole narrow portion 3 to the normal state but rather only at most a very narrow region of portion 3. And in some conditions of operation the current through the control circuit by itself cannot produce the normal material 13 but must be aided by the current through the gate circuit.

As previously mentioned, in one type of operation a gate circuit placed in parallel with a load circuit controls the current through the load circuit. When the gate circuit is superconductive no current flows through the load circuit while some current does flow if the gate circuit is reverted to the normal resistive state—the amount of current depending upon the resistances and inductances of the gate circuit and of the load. In the illustration of FIG. 6 we have illustrated a method of operation in which optimum efficiency is obtained.

In FIG. 6 a source 32 of current is connected by two conductors 33 in parallel with a cryogenic electronic device, such as illustrated in FIG. 1, and also with a load 34. Source 32 produces current pulses of a duration no longer than the thermal time constant of the gate circuit illustrated in film 2. By thermal time constant, we mean the time required for film 2 to cool below the critical temperature when the current through film 2 is not of sufficient magnitude to maintain film 2 above the critical temperature. A current source 35 produces current pulses conducted by conductors 36 to the control circuit film 4. Normally, that is when there are no curernt pulses from sources 35, the current from source 32 does not pass through load 34 but is shorted through the gate circuit 2. When it is desired to have current go through load 34 a pulse of sufficient length to ensure coincidence with the initiation of the pulse from source 32 is generated from source 35 and conducted to control circuit film 4. The pulse from 35 causes formation of the nucleus 13 of normal material across the width of film 2. Then the current from the source 32 propagates this normal material throughout the volume of film 2 thereby causing the gate circuit to completely revert to the normal state. Then current from the same pulse from source 32 flows through load 34 to the increase in resistance of the gate circuit. When current flows to load 34 less current flows through the film 2 and it begins to cool, and at the end of the thermal time constant reverts to the superconductive state. If the pulse from source 32 is no longer in duration than the thermal time constant of the material of film 2, none of the current from this pulse is required to maintain the temperature of film 2 above the critical temperature since the temperature of film 2 does not drop below the critical temperature until after the termination of the pulse, at which time film 2 can revert to the superconductive state without affecting the load current. Consequently, by utilizing current pulses from source 32 of duration no longer than the thremal time constant of film 2, the circuit can be designed for maximum efficiency. Of course, this method of operation is only preferred for those applications in which a pulsed load current is desired.

These pulses from source 32 can be increased in magnitude, without reverting the portion 3 to normal material, if their duration is made less than the time required to heat above the critical temperature the small normal regions that are believed to be created by the onrush of gate current. These regions, are so small that they never extend across the width of portion 3 and thus do not affect the zero resistance of the film 2. The limiting magnitude for these short pulses is the magnitude that produces the critical field.

This short pulse operation offers several advantages. The width of the gate circuit can be made narrower, and thus the resistance increased, for the same current carrying capacity if these very short pulses are used instead of longer pulses. Also, if the width of the gate circuit is kept the same, the short pulses can be increased in magnitude. These higher magnitude pulses increase the speed of propagation of the normal material produced by the control circuit, even though they have too short a duration for the propagation of the very small nuclei of normal material.

In summary, low inductance is obtained in the control circuit of the cryogenic electronic device of our invention by the utilization of a control circuit which is merely a straight, short, conductive path. Although this path can be a simple wire conductor, it preferably is a film of superconductive material since a film can be produced by printed circuit techniques. High resistance is obtained in the gate circuit by utilizing a thin elognated film of superconductive material. Of course the advantages of inductance decrease in the control circuit are obtained even though the gate circuit is not a thin film. But since for a short time constant and thus a high maximum frequency of operation, the combined low inductance control circuit and high resistance gate circuit are desired, the gate circuit is formed preferably from a film. Also a film can be produced by printed circuit techniques. This device is inexpensive since it is small, but not so small as to be difficult to produce, and is capable of being formed from inexpensive materials.

Another advantage of the present cryogenic electronic device can be had by using these devices in those applications in which the gate current produces the reverting of the gate circuit from the superconductive condition to the normal state. When prior cryogenic electronic devices are employed in these applications, a significant time lapse occurs between the application of the gate current and the formation of any resistance across the gate circuit. This time lapse is due to the time required for this gate current to cause small areas of normal material to propagate across the width of the gate circuit. There is no resistance until this material extends across the entire width of the gate circuit since prior to this time superconducting material is in parallel with the normal material. However, if the present cryogenic electronic device is used, the control circuit causes a condition across the entire width of the gate circuit such that upon the application of a gate current, there is immediately formed a nucleus of normal material extending across the width of the gate circuit. Thus, the gate circuit becomes resistive sooner than with prior cryogenic electronic devices.

While the invention has been described with respect to certain specific embodiments, it will be appreciated that many modifications and changes may be made by those skilled in the art without departing from the spirit of the invention. We intend, therefore, by the appended claims, to cover all such modifications and changes as fall within the true spirit and scope of our invention.

We claim:

1. A method of operating a cryogenic electronic device comprising an elongated member of superconductive material and a conductor extending transversely of the member, comprising the steps of applying a current pulse to the conductor, and applying a current pulse to the member of duration less than the thermal time constant of the member and at least partially simultaneously with the pulse applied to the conductor, wherein the magnitudes of the current pulses are sufficient to produce a narrow region of normal material across the width of the member.

2. The method as defined in claim 1 wherein the current pulse applied to the member is shorter in duration than the time required for current to heat above the critical temperature of the material small nuclei of normal material formed at small regions having a lower critical current than the average critical current of the superconductive material.

3. A method of operating a cryogenic electronic device comprising an elongated member of superconductive material and a conductor extending transversely of the member, comprising the steps of applying a current pulse to the conductor, and applying a current pulse to the member during the occurrence of the current pulse on the conductor and of a magnitude such that a narrow region of normal material is produced across the width of the member and caused to propagate over the total volume of the member.

4. The method as defined in claim 3 wherein the current pulse applied to the member is shorter in duration than the thermal time constant of the member.

5. A method of operating a cryogenic electronic device comprising an elongated member of superconductive material and a conductor extending transversely of the member, comprising the steps of applying current to the conductor, and applying current to the member during the occurrence of current flow through the conductor, the current applied to the member being of a magnitude such that a narrow region of normal material is produced across the width of the member and caused to propagate over the total volume of the member.

6. A cryogenic gating device comprising a gate member of superconductive material adapted to become superconducting when refrigerated, means for coupling a current through said gate member including input and output locations separated by said gate member, and means for producing only a narrow region of normal material transverse to said gate member between said locations, said region having a width at the point where it is transverse to said gate member which is less than about one-tenth the transverse dimension of said gate member, for blocking the flow of unimpeded supercurrent in said gate member.

7. A cryogenic gating device comprising a gate member which comprises a relatively flat elongated thin film of superconductive material deposited on a substrate, means for coupling a current through said elongated gate member between substantially opposite areas along said elongation, and means for producing a narrow region of normal material transverse to said elongated gate member, said latter means comprising a narrow conductor extending across, in close proximity to and insulated from said elongated gate member between the current coupling means, said conductor having a width where it crosses said gate member which width is less than about one-tenth the transverse dimension of said gate member.

8. The device as defined in claim 7 wherein said conductor is formed from superconductive material having a higher critical field than the material of said member.

9. A cryogenic gating device comprising a first elongated thin film of superconductive material, means for transmitting a current through said elongated thin film including current couplings thereto at two separated locations along the elongation of said film, and a second elongated thin film of superconductive material disposed with close spacing transversely over said first film while being insulated from the first film and having a width which is less than about one-tenth the width of said first film where it crosses the first film, so that a selected current in the second film may block the flow of unimpeded supercurrent in the first by rendering a narrow transverse area of the first film normally resistive.

10. A cryogenic gating device comprising a thin sheet of superconducting material providing a current carrying path, and a superconducting control conductor transversely crossing said path, said control conductor having a width less than about one-tenth the transverse dimension of said thin sheet where the control conductor crosses said thin sheet, and wherein the critical magnetic field of the control conductor is greater than the critical magnetic field of said sheet.

11. A cryogenic electronic device comprising an insulating substrate, a first elongated thin film of superconductive material on said substrate which film is less than a micron in thickness, means for coupling current thereto so that current may flow along said elongated thin film, a second elongated thin control film of superconductive material positioned with close spacing to carry a current in a direction transversely completely across the width dimension of said first elongated film, said control film having a width where it crosses the first film which is less than about one-tenth the width of the first film at that point, the critical temperature and field of said second film being higher than the critical tempeature and field of said first film, and means for operating said device at a temperature below but near the critical temperature of said films.

12. The device as defined in claim 11 wherein said second thin film forms a substantially straight current path.

13. A cryogenic gating device comprising a thin elongated gate member of superconducting material providing a current carrying path, a superconducting control conductor transversely crossing said path, said control conductor having a width less than about one-tenth the transverse dimension of said thin elongated gate member where the control conductor crosses said path, wherein the critical magnetic field of the conductor is greater than the critical magnetic field of said elongated gate member, and coupling means providing a current through said elongated gate member which current aids the onset of resistance in said elongated gate member by lowering the control current requirement for rendering the member resistive and which gate current is insufficient by itself for rendering said member resistive.

14. A cryogenic gating device comprising a thin film of superconducting material providing a current carrying path, and a superconducting control conductor transversely crossing said path which control conductor is narrow in width compared to the transverse dimension of said thin film, said control conductor having a width less than $\frac{1}{10}$ and greater than $\frac{1}{1000}$ the transverse dimension of said thin film where it crosses the film, the critical magnetic field of the control conductor being greater than the critical magnetic field of said film.

References Cited in the file of this patent

UNITED STATES PATENTS

| | | |
|---|---|---|
| 2,189,122 | Andrews | Feb. 6, 1940 |
| 2,914,735 | Young | Nov. 24, 1959 |
| 2,930,908 | McKeon | Mar. 29, 1960 |
| 2,989,714 | Park et al. | June 20, 1961 |

OTHER REFERENCES

IBM Journal, October 1957, pages 295–301, "Trapped-Flux Superconducting Memory," Crowe.

IBM Journal, October 1957, pages 304–308, "An Analysis of the Operation of a Persistent-Supercurrent Memory Cell," Garwin.